(12) United States Patent
Kazarian

(10) Patent No.: US 7,302,669 B1
(45) Date of Patent: Nov. 27, 2007

(54) METHOD AND SOFTWARE FOR GENERATING ENABLE AND DATA INPUT SIGNALS FOR FLIP-FLOPS USED FOR IMPLEMENTING LOGIC FUNCTIONS ON PROGRAMMABLE LOGIC DEVICES

(75) Inventor: Peter Kazarian, San Jose, CA (US)

(73) Assignee: Altera Corporation, San Jose, CA (US)

( * ) Notice: Subject to any disclaimer, the term of this patent is extended or adjusted under 35 U.S.C. 154(b) by 218 days.

(21) Appl. No.: 11/244,648

(22) Filed: Oct. 5, 2005

(51) Int. Cl.
*G06F 17/50* (2006.01)
(52) U.S. Cl. .......................... 716/16; 716/18
(58) Field of Classification Search ............. 716/16–18
See application file for complete search history.

(56) References Cited

U.S. PATENT DOCUMENTS 5,801,955 A * 9/1998 Burgun et al. ................ 716/6
6,301,553 B1 * 10/2001 Burgun et al. ................ 703/15

OTHER PUBLICATIONS

"Stratix Device Handbook, vol. 1", Altera Corporation, Jul. 2005.

* cited by examiner

*Primary Examiner*—Stacy Whitmore
(74) *Attorney, Agent, or Firm*—Beyer Weaver LLP

(57) ABSTRACT

Generating enable and data input signals for flip-flops used for implementing complex logic functions on a programmable logic device. The method includes ascertaining a behavioral logic equation that defines a logic function to be implemented on the programmable logic device, the logic function having one or more inputs and an output. A truth table is then derived from the behavioral logic equation. The truth table includes one or more minterms that collectively define all the possible states of the one or more inputs and the output of the logic function. Positive and negative cofactors of the logic function are defined from the minterms of the truth table. The defined positive and negative cofactors are used to ascertain an enable signal used to enable a flip-flop and logic circuitry to provide to a data input of the flip-flop. Together, the logic circuitry and the enable signal control the operation of the flip-flop to implement the logic function on the programmable logic device. In one embodiment, the aforementioned method is implemented in the programming software used for programming a PLD and maintained on a computer readable medium.

20 Claims, 7 Drawing Sheets

| Mid Term | A | B | C | Q | F |
|---|---|---|---|---|---|
| 1 | 0 | 0 | 0 | 0 | 0 |
| 2 | 0 | 0 | 0 | 1 | 1 |
| 3 | 0 | 0 | 1 | 0 | 0 |
| 4 | 0 | 0 | 1 | 1 | 1 |
| 5 | 0 | 1 | 0 | 0 | 0 |
| 6 | 0 | 1 | 0 | 1 | 1 |
| 7 | 0 | 1 | 1 | 0 | 0 |
| 8 | 0 | 1 | 1 | 1 | 1 |
| 9 | 1 | 0 | 0 | 0 | 0 |
| 10 | 1 | 0 | 0 | 1 | 1 |
| 11 | 1 | 0 | 1 | 0 | 0 |
| 12 | 1 | 0 | 1 | 1 | 1 |
| 13 | 1 | 1 | 0 | 0 | 0 |
| 14 | 1 | 1 | 0 | 1 | 0 |
| 15 | 1 | 1 | 1 | 0 | 1 |
| 16 | 1 | 1 | 1 | 1 | 1 |

METHOD AND SOFTWARE FOR GENERATING ENABLE AND DATA INPUT SIGNALS FOR FLIP-FLOPS USED FOR IMPLEMENTING LOGIC FUNCTIONS ON PROGRAMMABLE LOGIC DEVICES

BACKGROUND

1. Field of the Invention

The present invention generally relates to programmable logic devices, and more particularly, to a method and software for generating enable and data input signals for flip-flops used for implementing complex logic functions on programmable logic devices.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs can generally also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. The blocks of logic, often referred to by such names as Logic Elements (LEs), Adaptive Logic Modules (ALMs), or Complex Logic Blocks (CLBs), usually include one or more look up table (LUTs), programmable registers, adders, flip-flops and other circuitry to implement various logic and arithmetic functions.

For example in the Stratix PLD from Altera Corporation of San Jose, Calif., each Logic Array Block or LAB includes eight (8) Logic Elements (LEs). Each LE includes a flip-flop that is used as a synchronous element that is capable of capturing a logic state of a signal. The LAB also includes two hardwire enable signals (ENA1 and ENA2) that are distributed throughout the LAB and that can be selectively used to enable the flip-flops in the LEs respectively. Alternatively, another logic signal, such as one of the outputs of a LUT, can be used to enable the flip-flop. Regardless of where the enable signal is derived, during operation the flip-flop latches data at its input and provides the data at its output. If the flip-flop is not enabled, then the output remains constant, regardless of any data transitions that may occur at the input. For more information on the Stratix architecture, see the Stratix Device Family Data Sheet, Chapter 2: "Stratix Architecture", Ver. 3.3, July 2005, incorporated by reference herein for all purposes.

Programming software is typically used to program the PLDs. During logic design, the user is required to input the desired logic description into the programming software using a high level programming language, such as VHDL or Verilog. The software then synthesizes the high-level logic description into the needed basic logic components provided on the PLD, such as logic gates, flip-flops, and other logic constraints such as RAM, DSP, etc. During synthesis, the software also optimizes the design. Optimization involves finding the smallest, fastest and most power-efficient implementation of the logic design available on the PLD. The software next performs a place and route of the optimized logic design. Once the placement and routing is defined, the programming software generates a programming file which contains a plurality of bits used to program the PLD to implement the optimized logic function.

Since both VHDL and Verilog are behavioral languages, as opposed to structural languages, the description of the operation of a flip-flop is described in terms of a number of behavioral statements. For example, the code describing the operation of a flip-flop in Verilog can be represented as:

```
always@(posedge clock)
begin
   if(enable==1)
      output<=input;
end
```

The above Verilog code is interpreted as "if the enable input is a one (Vcc) on the positive edge transition of the clock, then the output equals the input". This differs from a structural definition of a flip-flop, which would contain a specific list of inputs, outputs, enable and clock signals, etc., to the various ports of the device.

Referring to FIG. 1, a circuit generated by the high level language defining the behavior of a flip-flop is shown. The circuit 10 includes a flip-flop 12 and a mux 14. The output of the mux 14 is provided to the D input of the flip-flop 12. The data output of the flip-flop 12 is provided to one input of the mux 14. A data signal 16 is provided to the other input of the mux 14. An enable signal ENA is provided to the select input 18 of the mux 14. When the ENA signal is high, the mux 14 provides the data input signal 16 to the D input of the flip-flop 12. Upon the next transition of clock CLK, the data signal is latched by the flip-flop 12 and provided at the Q output. If the ENA signal is low, the Q output signal is fed back to the input of flip-flop 12 through the mux 14. In this manner, the flip-flop is configured to retain its current value with each clock cycle while the ENA signal is low. Currently, the synthesis and place and route modules of most programming software packages used with PLDs would implement the flip-flop of FIG. 1 by using three input signals of a LUT in a logic element. For example, the data input signal 16, ENA signal 18, and Q output of the flip-flop 12 are all implemented using the input of the LUT. This means that only one of the four LUT input signals would be available for performing other logic. However, if the logic elements on the PLD had a hardwired enable signal available, the synthesis software could use the hardwire enable to simplify the circuit shown in FIG. 1.

Referring to FIG. 2, a circuit 20 of the simplified flip-flop using a hardwire enable is shown for the sake of illustration. The circuit 20 includes a flip-flop 22 with a data input 24, the hardwire ENA signal 24, and a clock signal CLK. The programming software optimizes the implementation of the flip-flop by taking advantage of and using the hardwire enable signal 26. The programming software implements this simplification by recognizing two characteristics of the circuit illustrated in FIG. 1. Namely, the software recognizes: (1) a two-to-one (2:1) mux feeding the data input of a flip-flop; and (2) one of the data inputs to the mux is an output of the flip-flop, creating a feedback loop. When both of these conditions are met, the programming software will recognize that the circuit is an enable flip-flop, and optimizes the circuit by using the hardware enable, removing the mux to implement the simplification.

The problem with existing programming software is that it is capable of performing the above-described optimization only in the most simple of situations. Generally speaking, the optimization can be performed only in cases where there is a single input, single enable flip-flop. In more complex situations, for example where a complex logic circuit is feeding a flip-flop, current programming software is unable to recognize that an optimization may be possible. As a result, the hardware enable is not used to simplify the logic. The complicated logic function and the flip-flop are therefore implemented using one or more LUTs which could otherwise be use to perform other logic functions. This shortfall typically results in an inefficient layout of the logic design, wasting resources on the PLD chip.

A method and software for generating enable and data input signals for flip-flops used for implementing complex logic functions on PLDs is therefore needed.

SUMMARY OF THE INVENTION

A method for generating enable and data input signals for flip-flops used for implementing complex logic functions on a programmable logic device. The method includes ascertaining a behavioral logic equation that defines a logic function to be implemented on the programmable logic device, the logic function having one or more inputs and an output. A truth table is then derived from the behavioral logic equation. The truth table includes one or more minterms that collectively define all the possible states of the one or more inputs and the output of the logic function. Positive and negative cofactors of the logic function are defined from the minterms of the truth table. The defined positive and negative cofactors are used to ascertain an enable signal used to enable the flip-flop and logic circuitry to provide a new data input of the flip-flop. Together, the logic circuitry and the enable signal control the operation of the flip-flop to implement the logic function on the programmable logic device. In one embodiment, the aforementioned method is implemented in the programming software used for programming a PLD and maintained on a computer readable medium.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as those using programmable devices, or application-specific integrated circuit (ASIC) devices, or a combination thereof.

Figure 1:
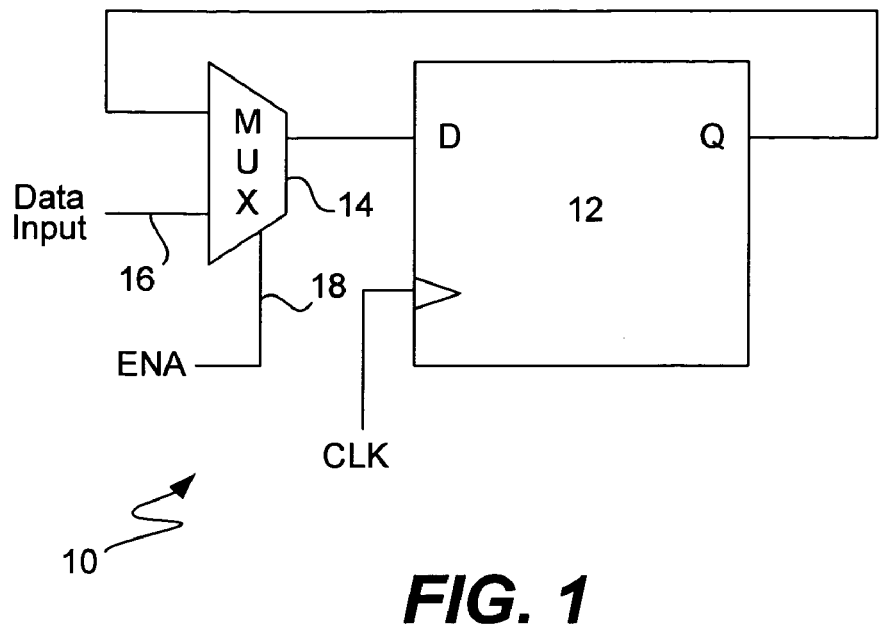
FIG. 1 is a flip-flop circuit generated by the high level language defining the behavior of the flip-flop.
Figure 2:
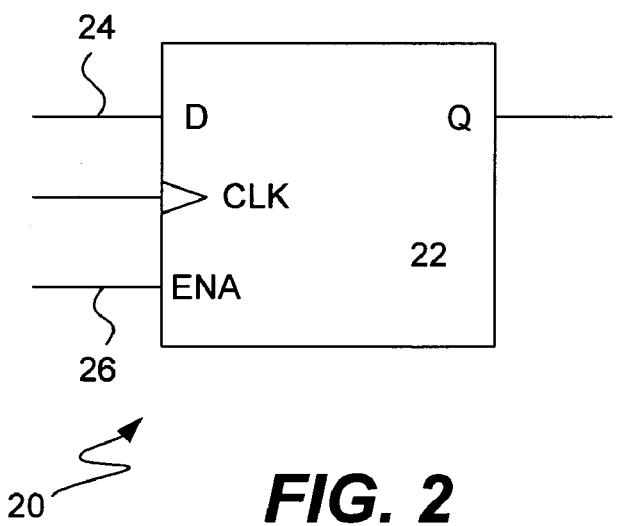
FIG. 2 is a circuit showing a simplified flip-flop using a hardwire enable.
Figure 3:
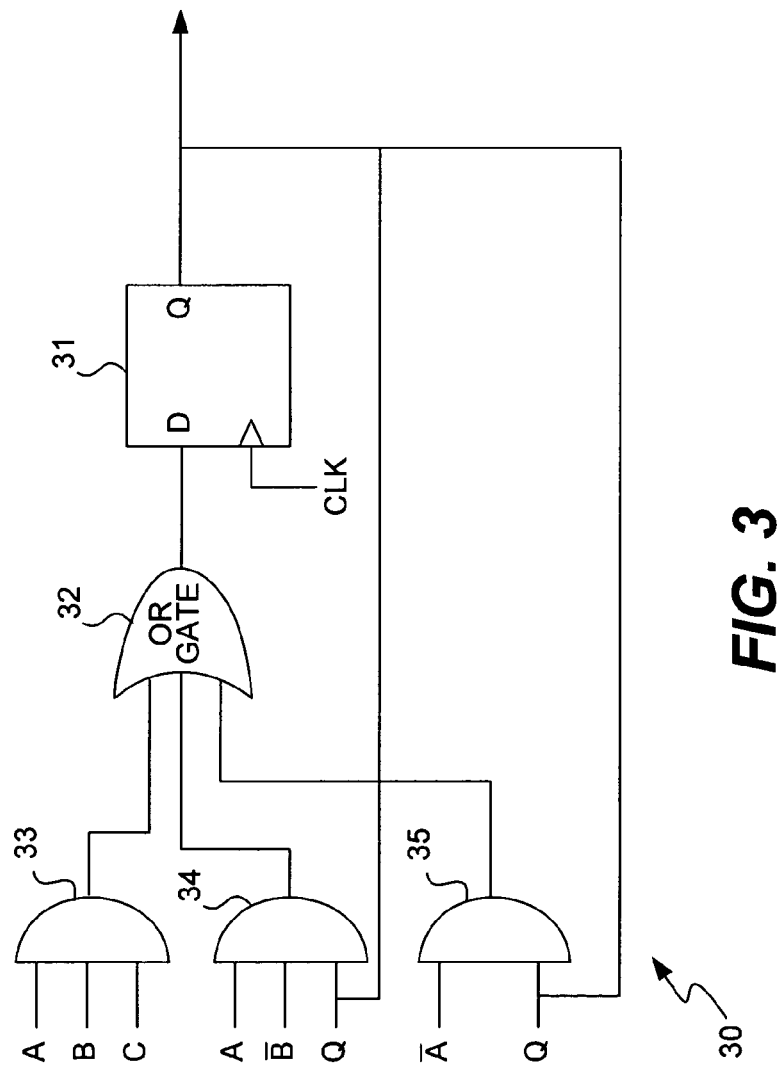
FIG. 3 is an example of a complicated logic function.

Referring to FIG. 3, a diagram of a complicated logic circuit shown for the purpose of explaining the present invention is shown. The logic circuit 30 includes a flip-flop 31, an OR gate 32, and three AND gates 33, 34 and 35. The flip-flop 31 receives the output of OR gate 32 at its D input. OR gate 32 receives the output of the three AND gates 33, 34 and 35. The AND 33 gate receives three logic signals A, B and C. The second AND gate 34 receives logic signals A, B and Q, the output of the flip-flop 31. The third flip-flop 35 receives Â and Q. When the signals A and B are both high, the output of AND gates 34 and 35 are both low. The output of AND gate 33 thus depends on the logic state of signal C. When logic signal C is high, the output of AND gate 33 is high. As a result, the output of OR gate 32 is high. The Q output of flip-flop 31 is therefore high with the next transition of clock CLK. If logic signal A is low, then the outputs of AND gates 33 and 34 are low, regardless of the logic state of B. The output of AND gate 35, however, is high, resulting in the Q output of the flip-flop 31 equaling the previous value of Q. Lastly, if A is high and B is low, then the output of AND gates 33 and 35 will both be low. The output of AND gate 34, however, will be high and the value of Q upon the next clock transition CLK will equal the previous value of Q.

With the prior art synthesis software, the logic circuit of FIG. 3 would not be implemented using a flip-flop on the PLD because the above two defined characteristics would not be met. Namely, the logic circuit 30 does not have: (1) a two-to-one (2:1) mux feeding the data input of a flip-flop; and (2) there is no feedback loop between the output of a flip-flop and a mux. Consequently the synthesis software would implement the logic portion of the circuit using a LUT with four (4) inputs. The four inputs are A, B, C, and Q. In a PLD with four input LUTs, a single LUT would therefore have to be used to implement the logic portion of the circuit.

Figures 4, 5:
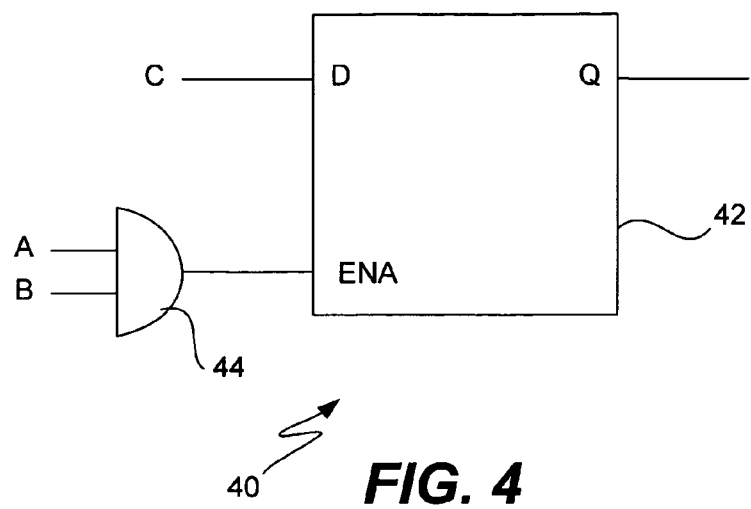
FIG. 4 is a simplified version of the logic shown in FIG. 3 using a flip-flop according to the present invention.
FIG. 5 is a truth table for the logic function of FIG. 3.

Referring to FIG. 4, a simplified version of the logic shown in FIG. 3 is shown. The circuit 40 includes a flip-flop 42 and an AND gate 44. The flip-flop 42 is configured to receive the logic signal C at its D input. The AND gate 44 is configured to receive logic signals A and B. The output of the AND gate 44 is provided to an enable input ENA of the flip-flop 42. A review of the circuits illustrated in FIGS. 3 and 4 indicate that they both implement the same logic function. With the circuit of FIG. 4, when both the A and B logic signals are high, the enable input ENA is active. As a result, the flip-flop 42 latches the signal C at its data input. The Q output of the flip-flop 42 is therefore equal to the value of signal C. When either A or B or both are low, then the enable signal ENA is not active. The flip-flop 42 will not latch the data at its input and the output Q of the flip-flop 44 remains the same. As discussed above, the complex logic of FIG. 3 operates in the same manner.

The simplified logic of FIG. 4 could therefore be implemented on a PLD using two LUTs. The first LUT would perform the flip-flop function, the second performing the enable ENA function (i.e., A*B). If the above logic is a one of a kind circuit in a users design, then the use of two LUTs is actually less efficient that using the single 4 input LUT as described above with regard to FIG. 3. However, in many instances, a users design will often include many logic functions with the same enable signal. In these situations, the enable signal can be implemented in a single LUT and shared among all the logic functions. This would be more efficient than using multiple LUTs to implement each of the logic functions respectively.

The process according to the present invention for generating enable and data input signals for flip-flops used for implementing logic functions on PLDs is herein described using the above circuit of FIG. 3 as an example.

In the initial step, the logic circuit is converted into a behavioral logic equation that defines the logic function. For example, the circuit of FIG. 3 can be defined where F is the data input of the flip-flop as:

$F=(A*B*C)+(A*\hat{B}*Q)+(\hat{A}*Q)$

In the next step, a truth table of the logic function is defined. Referring to FIG. 5, a truth table 50 showing all the possible minterms of the function F is provided. Once the truth table is defined, then all the minterms are analyzed. The value of Q represents the state of the flip-flop before the next clock triggers. The value of F represents the state of the flip-flop after the next clock triggers. Any minterm where the value of Q differs from the value of F represents a set of inputs that cause the flip-flop to change state when the next clock triggers. These minterms are identified in order to generate an enable signal. In this example, minterm 14 represents a set of inputs that would cause the flip-flop to transition from 1 to 0, whereas minterm 15 represents a set of inputs that would cause the flip-flop to transition from 0 to 1. Minterms 14 and 15 are designated in the figure by reference numeral 52. An enable signal therefore needs to be active for all minterms that represent a change in the state of a flip-flop. In this example, the enable signal ENA needs to be active only for the two minterms 14 and 15 where the values of Q and F differ. In all the other minterms, it is a "don't care" situation. It does not matter if the enable signal ENA is a logic zero (0) or a logic one (1).

In the subsequent step, a logic equation defining the operation of the enable ENA signal is defined by combining all of the minterms where the values of Q and F differ. The set of minterms where the value of Q is zero (0) and the value of F is one (1) are determined by substituting zero (0) for the value of Q in the equation for F and simplifying the equation. This is known as the negative cofactor of the equation F with respect to the input Q. In this example, substituting zero (0) for the value of Q results in the following equation:

$F(Q=0)=A*B*C$

The set of minterms where the value of Q is one (1) and the value of F is zero (0) are determined by first finding the set of minterms where the value of Q is one (1) and the value of F is one (1). The set of minterms where the value of Q is one (1) and the value of F is one (1) are determined by substituting one (1) for the value of Q in the equation for F and simplifying the equation. This is known as the positive cofactor of the equation F with respect to the input Q. In this example, substituting one (1) for the value of Q results in the following equation:

$F[Q=1]=\hat{A}+\hat{B}+C$

The set of minterms where the value of Q is one (1) and the value of F is zero (0) is the same as the set of minterms where the value of Q is one (1) and the value of F is not one (1). Thus the set of minterms where the value of Q is one (1) and the value of F is zero (0) is determined by inverting the above equation representing the minterms where the value of Q is one (1) and the value of F is one (1). This is the inverse of the positive cofactor of the equation F with respect to Q. This equation is defined as:

$$\overline{F[Q=1]} = \overline{\overline{A} + \overline{B} + C}$$

The above equation simplifies to:

$\hat{F}[\hat{Q}=\hat{1}]=A*B*\hat{C}$

Figure 6A:
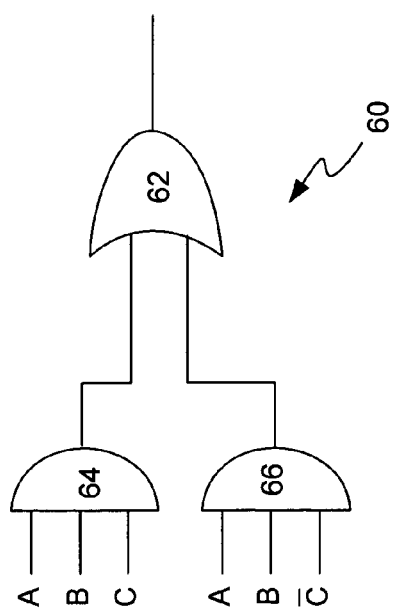
FIG. 6A is a logic diagram illustrating the combination of two cofactors of the complex logic circuit of FIG. 3 according to the present invention.

The negative cofactor and inverted positive cofactor are then combined using a logical OR operation. Referring to FIG. 6A, a logic diagram illustrating the combination of the two cofactors is shown. The logic diagram 60 includes an OR gate 62, an AND gate 64 and another AND gate 66. The OR gate 62 is configured to receive the outputs of the two AND gates 64 and 66. The first AND gate 64 is configured to receive the logic signals A, B and C representing the negative cofactor. The second AND gate 66 is configured to receive the logic signals A, B and $\hat{C}$, representing the inverted positive cofactor.

Figure 6B:
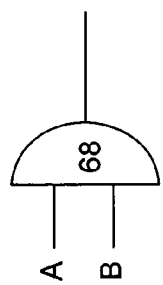
FIG. 6B is a simplified version of the combination of the two cofactors illustrated in FIG. 6A according to the present invention.

A review of the logic circuit 60 indicates that it can be simplified. The circuit 60 can be simplified to a simple AND gate 68 with inputs A and B, as illustrated in FIG. 6B. When both A and B are logic high, the output of either AND gates 64 or 66 will be high, depending on the value of C. If C is a logic one, then the output of AND gate 64 is high and the output of AND gate 66 is low. If C is a logic zero, then the output of AND gate 66 is high and AND gate 64 is low. In either case, one input to the OR gate 62 is high. The output of the logic OR gate 62 will therefore be high. On the other hand, if either A or B are low, the output of both AND gates 64 and 66 will always be low. Consequently, the output of OR gate 62 will also be low. The AND gate 68 of FIG. 6B is therefore the logical equivalent of circuit 60 of FIG. 6A. The simplified AND gate 68 thus defines the enable equation for the ENA signal.

It should be noted that in certain circumstances, it may not be possible to define the enable signal ENA. If the inverted positive cofactor ($F_{Q=1}$) and the negative cofactor ($F_{Q=0}$) can both be equal to one (1) for a given set of inputs (in the above example, A, B and C), then the technique of the present invention described herein will not work. On the contrary, the inverted positive cofactor and the negative cofactor need to be exclusive. If they are not exclusive, then the ENA signal can not be defined and conventional synthesis techniques using LUTs should be used.

The logic for implementing the logic function of circuit 30 of FIG. 3 using a flip-flop can also be derived from the minterms provided in FIG. 5. In other words, the logic provided to the data input of the flip-flop can be defined from a similar truth table used for defining the enable signal ENA.

In the subsequent step, a logic equation defining the new data input to the flip-flop is defined. The new data input equation must equal 1 for the minterms of the equation F where Q is zero (0) and F is one (1). This represents the case where the state of the flip-flop is zero (0) and the data input to the flip-flop is one (1). Therefore, the set of minterms for the new data input equation must be a superset of the set of minterms described by the negative cofactor of F with respect to Q. The new data input equation must also equal zero (0) for the minterms of the equation F where Q is one (1) and F is zero (0). This represents the case where the state of the flip-flop is one (1) and the data input to the flip-flop is zero (0). Therefore, the set of minterms for the new data input equation must not include the set of minterms described by the inverted positive cofactor of F with respect to Q. This is equivalent to saying the set of minterms for the new data input equation must be a subset of the positive cofactor of F with respect to Q. When Q is zero (0) and F is zero (0), the value of the new data input equation does not matter because the value of the enable equation will be zero (0) for those minterms. Similarly, when Q is one (1) and F is one (1), the value of the new data input equation does not matter because the value of the enable equation will also be zero (0) for those minterms. Thus, there are multiple possibilities for a new data input equation.

A new data input equation with the least number of input variables is desired. This is because the new data input equation will be implemented with one or more LUTs, and fewer inputs will result in more efficient logic. If all possible sets of minterms of the equation F that are both supersets of the negative cofactor of F with respect to Q and subsets of the positive cofactor of F with respect to Q are enumerated, an equation can be formulated for each. After each equation is simplified, the number of input variables can be counted. The equation with the least input variables would then be chosen to be the new data input equation. In this example, the new data equation would be C, because that is the equation with the fewest input variables that meets the above criteria.

Enumerating all possible sets of minterms for a new data input equation may be deemed too slow for some software. In this case, a heuristic for choosing a new data input equation should be used. In the heuristic used by the present embodiment, a Binary Decision Diagram (BDD) is created for both the negative cofactor of F and the enable equation. Then, the Coudert and Madre restrict function is applied to F using the enable equation as the domain. The result is used as the new data input function. In this example, the restrict function is applied to $F_{Q=0}$=A*B*C (the negative cofactor of F with respect to Q) over the domain of the enable equation, A*B. The result is C, which is the optimal result. This heuristic has been determined to find the optimal result in most cases and is faster than enumerating all cases. For more information on the Coudert and Madre restrict function, see Coudert, O., Madre, J. C.: "A Unified Framework for the Formal Verification of Sequential Circuits"; Proc. International Conference on Computer-Aided Design, ACM, New York (1990), 126-129, incorporated by reference herein for all purposes.

Figure 7:
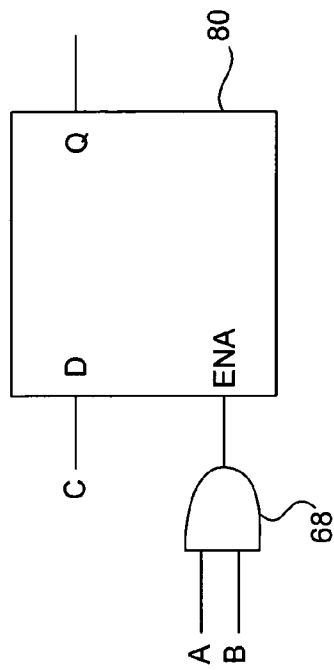
FIG. 7 is a diagram illustrating the logic function of FIG. 3 implemented using a flip-flop according to the present invention.

Referring to FIG. 7, a circuit diagram illustrating the logic function of FIG. 3 implemented using a flip-flop according to the present invention is shown. The circuit diagram includes the flip-flop 62 and an AND gate 82. The flip-flop is configured to receive the signal C at its D input. AND gate 62 is configured to receive signals A and B and generate the enable signal ENA as described above with regard to FIGS. 6A and 6B. The enable input ENA of the flip-flop 80 is configured to receive the output of the AND gate 62. As noted above, the flip-flop 80 only needs to be enabled when signals A and B are at logic high levels. When the flip-flop is enabled, the data latched by the flip-flop 82 is the value of signal C. This arrangement thus implements the logic circuitry of FIG. 3.

Figure 8:
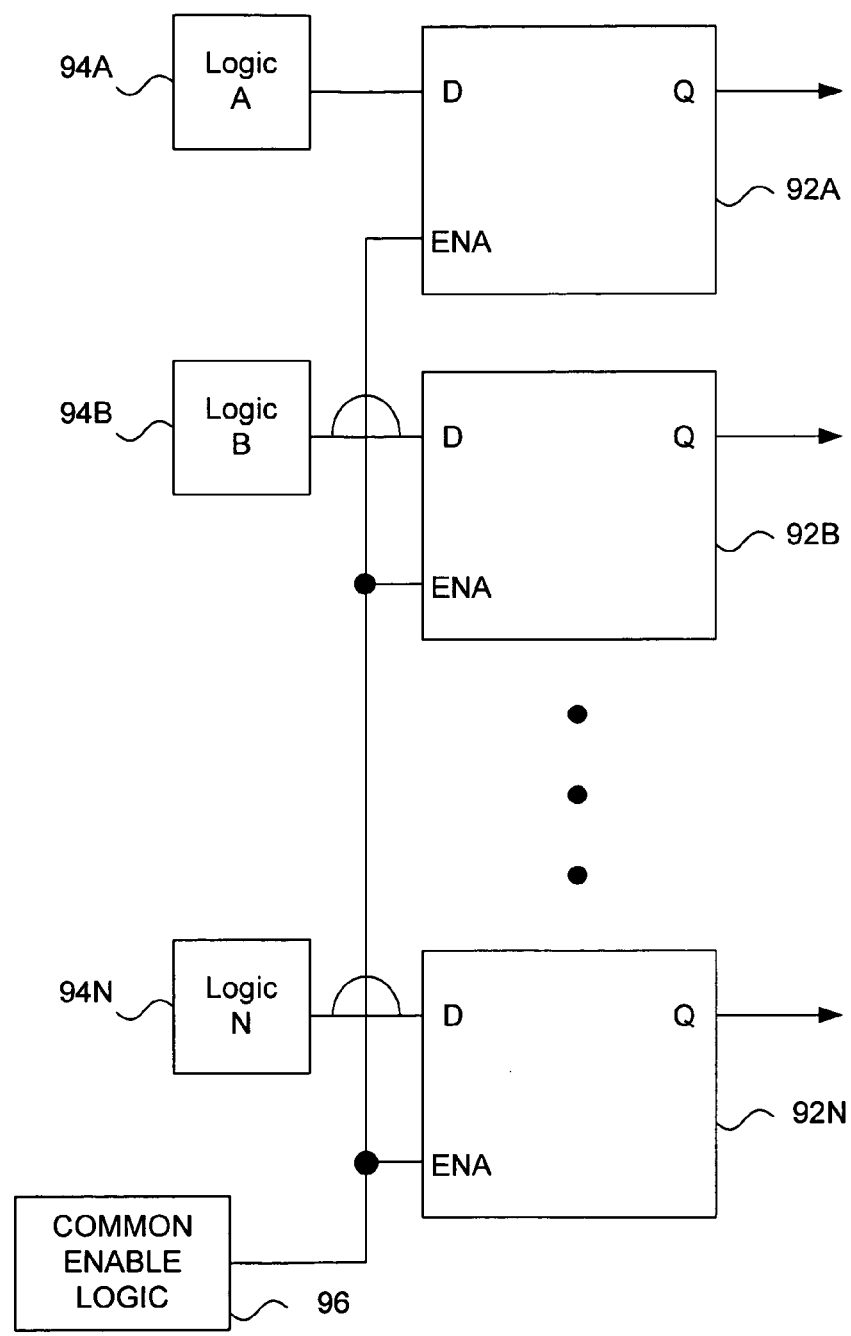
FIG. 8 is block diagram illustrating an implementation of the present having a common enable shared among multiple logic functions.

Referring to FIG. 8, a block diagram illustrating an implementation of the present invention according to one embodiment is shown. The diagram 90 includes a plurality of flip-flops $92_A$-$92_N$, a plurality of logic circuits $94_A$-$94_N$, and common enable logic 96. The plurality of logic circuits $94_A$-$94_N$ are each coupled to the D inputs of flip-flops $92_A$-$92_N$ respectively. The common enable logic 96 is coupled to the enable input ENA of each of the flip-flops $92_A$-$92_N$ respectively. The present invention is particularly effective when multiple logic functions in a user's design share common enable logic. In the example illustrated, the flip-flops $92_A$-$92_N$ each share the common enable logic 96. However, the logic $94_A$-$94_N$ provided to each of the flip-flops $92_A$-$92_N$ may be the same or different. According to one embodiment, the common enable logic 96 is implemented in a LUT on the PLD.

Generally speaking, when a number of logic circuits share a common enable, it is typically useful to implement the common enable in a single LUT (or multiple LUTs if necessary). The common enable is then shared across the number of logic circuits. This arrangement is usually more efficient than separately creating an enable circuit for each logic function. During design optimization, the number of LUTs used to implement the common enable should be compared to the number of LUTs needed to implement the individual enable circuits for each of the logic functions. If the number of LUTs saved exceeds a predetermined threshold, then: (i) flip-flops should be used to implement the logic functions where possible; and (ii) the LUTs should be used to implement the common enable. Otherwise, the logic functions and the enable circuits should both be individually implemented using LUTs.

While the specific logic circuit of FIG. 3 was used for the purpose of illustrating the methodology of the present invention, it should in no way be construed as limiting the present invention. Rather, it should be understood that the present invention can be used for possibly implementing a wide range of logic functions.

Figure 9A:
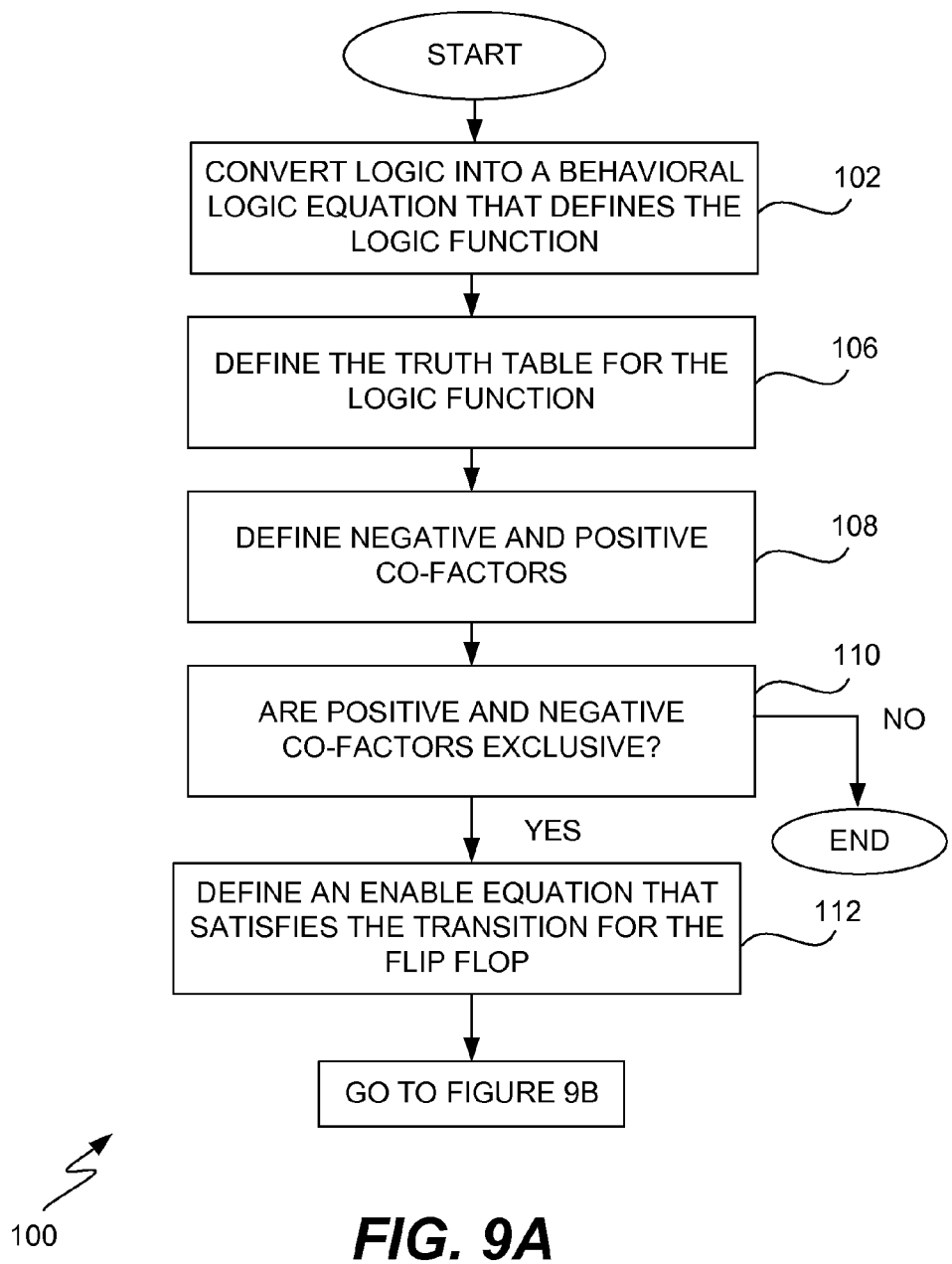
FIGS. 9A and 9B are a flow chart illustrating the sequence of the present invention.
Figure 9B:
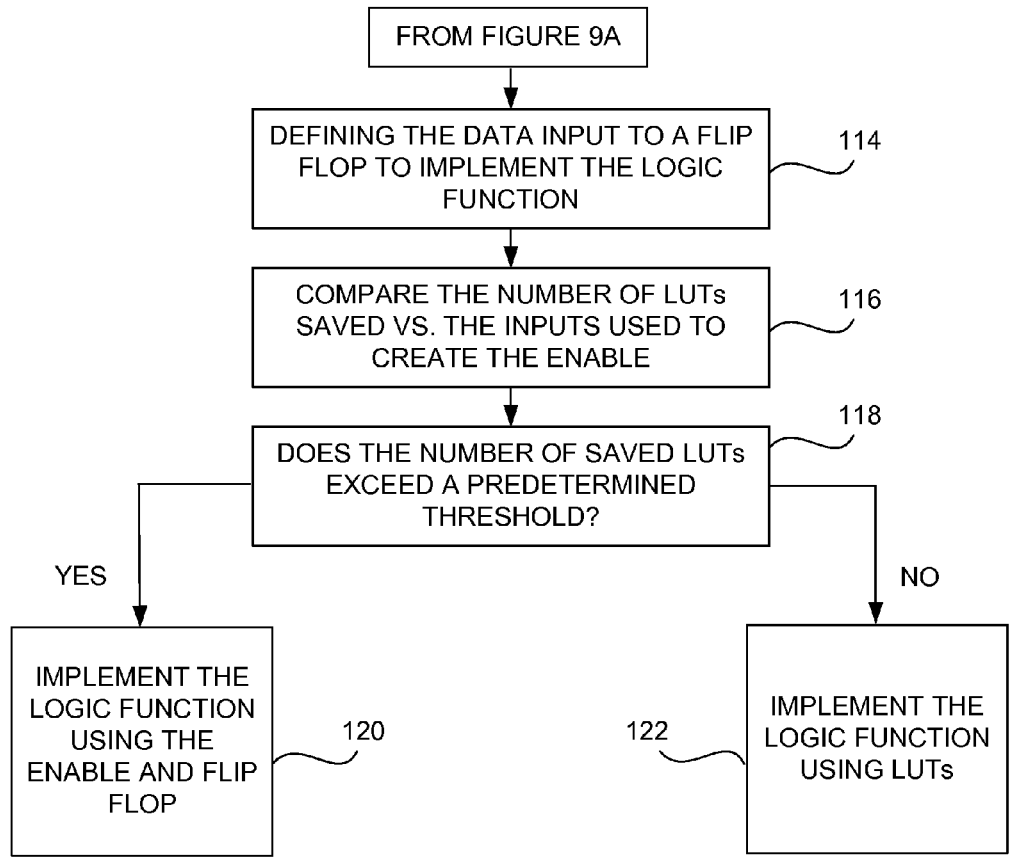

Referring to FIGS. 9A and 9B, a flow chart 100 illustrating the general sequence of the present invention is provided. In the initial step 102, the logic function is converted into a behavioral logic equation that defines the logic function (step 102). From the logic equation, a truth table including all the minterms of the logic function is defined (box 106). The negative and positive cofactors are then derived from the minterms of the truth table (box 108). In step 110, the positive and negative cofactors are examined to determine if they are exclusive or not. If NO, the, the process is concluded. If YES, then the enable equation for the logic function is determined from the positive and negative cofactors (box 112). The data input to the flip-flop that is configured to implement the logic function is then defined (box 114). Once the enable and data inputs are defined, the number of LUTs saved by implementing the logic function using a flip-flop and the enable signal is compared to using exclusively LUTs to implement the same (box 116). If the number of saved LUTs exceeds a predetermined threshold (decision box 118), then the logic function should be implemented using the enable signal and a flip-flop (box 120). Otherwise it would be more efficient to implement the function using the LUTs available on the PLD (box 122).

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method for implementing a logic function using a flip-flop on a programmable logic device comprising:
    ascertaining a behavioral logic equation that defines the logic function to be implemented on the programmable logic device, the logic function having one or more inputs and an output;
    deriving a truth table from the behavioral logic equation, the truth table including one or more minterms that collectively define all the possible states of the one or more inputs and the output;
    defining positive and negative cofactors of the logic function from the minterms of the truth table;
    ascertaining an enable signal from the defined positive and negative cofactors used to enable the flip-flop; and
    ascertaining logic circuitry to provide to a data input of the flip-flop, wherein,
        the logic circuitry and the enable signal together control the operation of the flip-flop to implement the logic function on the programmable logic device.

2. The method of claim 1, further comprising ascertaining an inverted positive cofactor from the positive cofactor of the logic function.

3. The method of claim 2, wherein the inverted positive cofactor of F with respect to Q is defined by ascertaining which minterms in the truth table define Q as a logic one and F as a logic zero, where Q is the output of the flip-flop and F is the behavioral logic equation that defines the logic function to be implemented.

4. The method of claim 1, wherein the negative cofactor of F with respect to Q is defined by ascertaining which minterms in the truth table define Q as a logic zero and F as a logic one, where Q is the output of the flip-flop and F is the behavioral logic equation that defines the logic function to be implemented.

5. The method of claim 1, further comprising:
    ascertaining if the inverted positive cofactor and the negative cofactor are exclusive; and
    implementing the logic function using the flip-flop if the inverted positive cofactor and the negative cofactor are exclusive.

6. The method of claim 1, wherein ascertaining the enable signal from the defined inverted positive cofactor and the defined negative cofactor to enable the flip-flop further comprises combining the negative cofactor and the inverted positive cofactor using a logical OR operation.

7. The method of claim 6, further comprising performing logic simplification of the combined negative and inverted positive cofactors.

8. The method of claim 1, wherein ascertaining the logic circuitry provided to the data input of the flip-flop further comprises:
    choosing a first set among the one or more minterms as a superset of the minterms defined by the negative cofactor, wherein the superset is also a subset of the positive cofactor;
    ascertaining the logic circuitry from the superset of the minterms; and
    simplifying the logic circuitry ascertained from the superset of the minterms if possible.

9. The method of claim 1, further comprising sharing the ascertained enable signal across a plurality of logic function implemented using flip-flops on a programmable logic device respectively.

10. The method of claim 1, further comprising:
    defining a plurality of logic functions having a common enable signal;
    determining a first number of look up tables on the programmable logic device needed to implement the common enable signal for each of a plurality of logic functions;
    determining a second number of look up tables on the programmable logic device needed to individually implement each of the plurality of logic functions;
    comparing the first and second number of look up tables; and either:
        implementing the plurality of logic functions in a plurality of flip-flops and the common enable signal if the first number of look up tables exceed the second number of look up tables by a predetermined threshold; or
        implementing the plurality of logic functions in individual look up tables if the first number of look up tables does not exceed the second number of look up tables by the predetermined threshold.

11. A computer readable medium for implementing a logic function using a flip-flop on a programmable logic device comprising:
    ascertaining a behavioral logic equation that defines the logic function to be implemented on the programmable logic device, the logic function having one or more inputs and an output;
    instructions configured to derive a truth table from the behavioral logic equation, the truth table including one or more minterms that collectively define all the possible states of the one or more inputs and the output;
    instructions configured to define positive and negative cofactors of the logic function from the minterms of the truth table;
    instructions configured to ascertain an enable signal from the defined positive and negative cofactors used to enable the flip-flop; and instructions configured to ascertain logic circuitry to provide to a data input of the flip-flop, wherein, the logic circuitry and the enable signal together control the operation of the flip-flop to implement the logic function on the programmable logic device.

12. The computer readable medium of claim 11, further comprising instructions for ascertaining an inverted positive cofactor from the positive cofactor of the logic function.

13. The computer readable medium of claim 12, wherein the instructions for ascertaining the inverted positive cofactor of F with respect to Q further comprise instructions for ascertaining which minterms in the truth table define Q as a logic one and F as a logic zero, where Q is the output of the flip-flop and F is the behavioral logic equation that defines the logic function to be implemented.

14. The computer readable medium of claim 11, wherein the instructions for ascertaining the negative cofactor of F with respect to Q further comprise instructions for ascertaining which minterms in the truth table define Q as a logic zero and F as a logic one, where Q is the output of the flip-flop and F is the behavioral logic equation that defines the logic function to be implemented.

15. The computer readable medium of claim 11, further comprising instructions for:

ascertaining if the inverted positive cofactor and the negative cofactor are exclusive; and implementing the logic function using the flip-flop if the inverted positive cofactor and the negative cofactor are exclusive.

16. The computer readable medium of claim 11, wherein the instructions for ascertaining the enable signal from the defined inverted positive cofactor and the defined negative cofactor to enable the flip-flop further comprises instructions for combining the negative cofactor and the inverted positive cofactor using a logical OR operation.

17. The computer readable medium of claim 16, further comprising instructions for performing logic simplification of the combined negative and inverted positive cofactors.

18. The computer readable medium of claim 11, wherein the instructions for ascertaining the logic circuitry provided to the data input of the flip-flop further comprises instructions for:

choosing a first set among the one or more minterms as a superset of the minterms defined by the negative cofactor, wherein the superset is also a subset of the positive cofactor;

ascertaining the logic circuitry from the superset of the minterms; and simplifying the logic circuitry ascertained from the superset of the minterms if possible.

19. The computer readable medium of claim 11, further comprising instructions for sharing the ascertained enable signal across a plurality of logic function implemented using flip-flops on a programmable logic device respectively.

20. The computer readable medium of claim 11, further comprising instructions for:

defining a plurality of logic functions having a common enable signal;

determining a first number of look up tables on the programmable logic device needed to implement the common enable signal for each of a plurality of logic functions;

determining a second number of look up tables on the programmable logic device needed to individually implement each of the plurality of logic functions;

comparing the first and second number of look up tables; and either:

implementing the plurality of logic functions in a plurality of flip-flops and the common enable signal if the first number of look up tables exceed the second number of look up tables by a predetermined threshold; or implementing the plurality of logic functions in individual look up tables if the first number of look up tables does not exceed the second number of look up tables by the predetermined threshold.

* * * * *